(12) United States Patent
Chen et al.

(10) Patent No.: US 11,569,227 B2
(45) Date of Patent: Jan. 31, 2023

(54) THREE-WAY SWITCH ARRAY STRUCTURE AND SWITCH ARRAY SUBSTRATE BASED ON NVM

(71) Applicant: MACRONIX INTERNATIONAL CO., LTD., Hsinchu (TW)

(72) Inventors: Shih-Hung Chen, Hsinchu County (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 137 days.

(21) Appl. No.: 17/166,081

(22) Filed: Feb. 3, 2021

(65) Prior Publication Data

US 2022/0246607 A1    Aug. 4, 2022

(51) Int. Cl.
*H01L 27/088*      (2006.01)
*H01L 27/11521*   (2017.01)
*H01L 27/11556*   (2017.01)

(52) U.S. Cl.
CPC ...... *H01L 27/088* (2013.01); *H01L 27/11521* (2013.01); *H01L 27/11556* (2013.01)

(58) Field of Classification Search
None
See application file for complete search history.

(56) References Cited

U.S. PATENT DOCUMENTS 10,763,827 B1 *   9/2020   Christange .............. H03H 7/345

\* cited by examiner

*Primary Examiner* — Hsien Ming Lee
(74) *Attorney, Agent, or Firm* — McClure, Qualey & Rodack, LLP

(57) ABSTRACT

A three-way switch array structure including N first connectors, M second connectors, N×M third connectors and N×M three-way switches is provided, each three-way switch has a first terminal, a second terminal, a third terminal, a first switch and a second switch. Each of first terminals is disposed on one of the first connectors, each of second terminals is disposed on one of the second connectors, and each of third terminals is disposed on one of the third connectors, the first switch is disposed between the first terminal and the third terminal, and the second switch is disposed between the second terminal and the third terminal, wherein N and M are positive integers greater than or equal to 1.

19 Claims, 7 Drawing Sheets

THREE-WAY SWITCH ARRAY STRUCTURE AND SWITCH ARRAY SUBSTRATE BASED ON NVM

BACKGROUND OF THE INVENTION

Field of the Invention

The invention relates in general to a three-way switch array structure and a switch array substrate based on Non-Volatile Memory (NVM).

Description of the Related Art

Solder-free universal circuit boards (commonly known as "breadboards") are used for electronic components to be repeatedly assembled onto or disassembled from an electronic component configuration carrier so as to lay out electronic circuits with a specific function. However, only two-dimensional connectors connecting the electronic components are available for the electronic component configuration carrier, so the space utilization rate of the electronic components cannot be improved.

In addition, for the electronic circuit layout of memory array, the memory can be manufactured into an array composed of a plurality of memory cells to read data stored in the memory cell or write data into the memory cell. The data of the memory cell can be configured to store two or more than two levels or states (for example, 0 or 1). Common memory cell includes a transistor and a capacitor for access of data. The transistor, called an access device, is used to selectively access capacitor. The capacitor for electrostatically storing energy in capacitor dielectric layer between two capacitor plates is used to indicate the state of the memory cell.

In order to construct an electronic circuit having three-dimensional layout, so that the electronic components are vertically stacked to each other, it is necessary to develop or newly design an electronic component configuration carrier with a three-way switch array structure for use. At the same way, in order to construct a memory array on a three-dimensional space, so that the memory cells are vertically stacked to each other and the level or state of each memory cell can be controlled, it is also necessary to develop or newly design a semiconductor substrate with a three-way switch array structure for use.

SUMMARY OF THE INVENTION

The present invention relates to a three-way switch array structure and a switch array substrate based on Non-Volatile Memory (NVM).

According to one aspect of the present invention, a three-way switch array structure including N first connectors, M second connectors, N×M third connectors and N×M three-way switches is provided, each three-way switch has a first terminal, a second terminal, a third terminal, a first switch and a second switch. Each of first terminals is disposed on one of the first connectors, each of second terminals is disposed on one of the second connectors, and each of third terminals is disposed on one of the third connectors, the first switch is disposed between the first terminal and the third terminal, and the second switch is disposed between the second terminal and the third terminal, wherein N and M are positive integers greater than or equal to 1.

According to one aspect of the present invention, a switch array substrate based on NVM is provided, which includes N first connectors; M second connectors; N×M third connectors; N×M three-way switches, each three-way switch has a first terminal, a second terminal, a third terminal, a first memory cell and a second memory cell, wherein each of the first terminals is disposed on one of the N first connectors, each of the second terminals is disposed on one of the M second connectors, each of the third terminals is disposed on one of the N×M third connectors, the first memory cell is disposed between the first terminal and the third terminal, and the second memory cell is disposed between the second terminal and the third terminal, where N and M are positive integers greater than or equal to 1; and a semiconductor substrate for disposing the N first connectors, the M second connector, the N×M third connectors and the N×M three-way switches.

Other objects, features, and advantages of the invention will become apparent from the following detailed description of the preferred but non-limiting embodiments. The following description is made with reference to the accompanying drawings.

Figure 1:
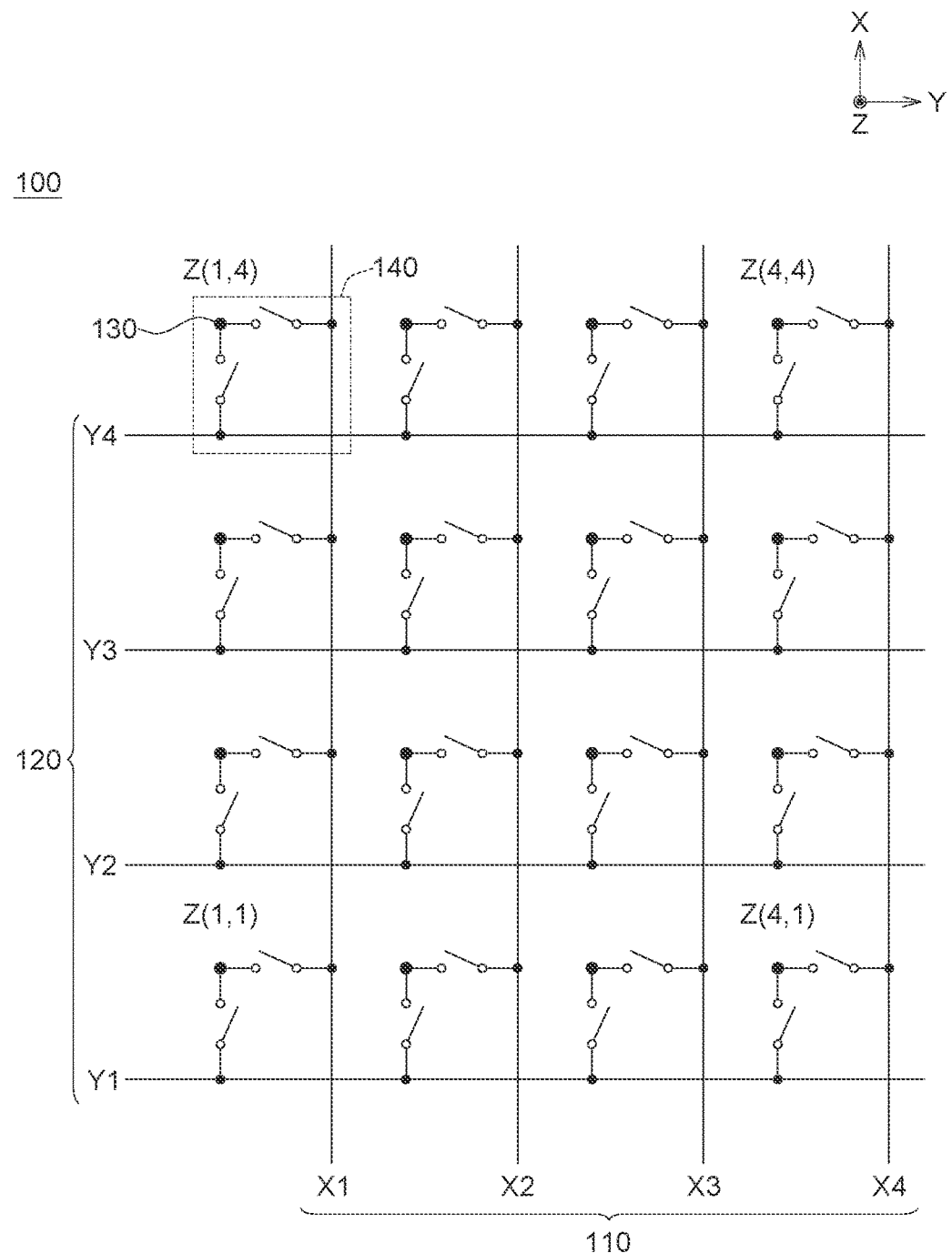
FIG. 1 is a schematic diagram of a three-way switch array structure according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

Details are given in the non-limiting embodiments below. It should be noted that the embodiments are illustrative examples and are not to be construed as limitations to the claimed scope of the present invention. The same/similar denotations are used to represent the same/similar components in the description below.

Figure 2A:
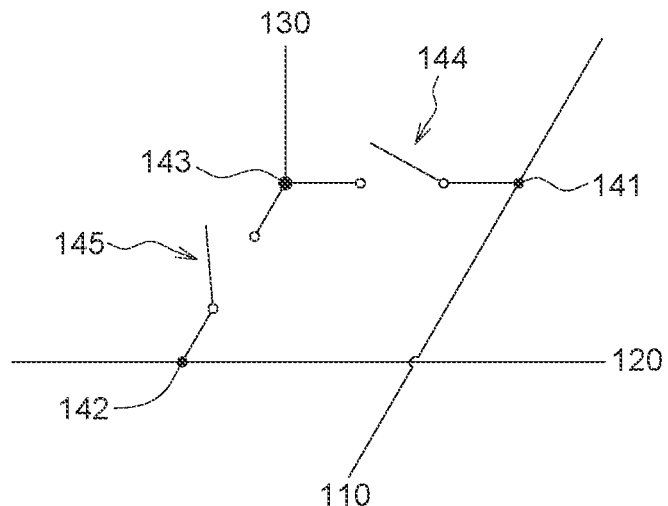
FIGS. 2A and 2B respectively show schematic diagrams of a three-way switch of FIG. 1.
Figure 2B:
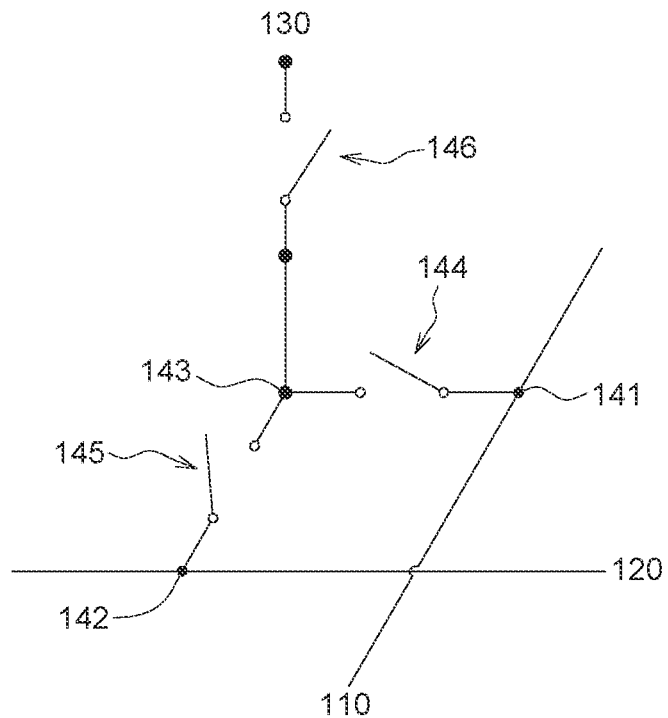

Please refer to FIGS. 1, 2A and 2B. FIG. 1 is a schematic diagram of a three-way switch array structure 100 according to an embodiment of the present invention, and FIGS. 2A and 2B respectively show schematic diagrams of a three-way switch array structure 140 of FIG. 1.

According to an embodiment of the present invention, the three-way switch array structure 100 includes a plurality of first connectors 110, a plurality of second connectors 120, a plurality of third connectors 130, and a plurality of three-way switches 140. The first connector 110 is a conductive line extending along a first direction X, the second connector 120 is a conductive line extending along a second direction Y, and the third connector 130 is a conductive line extending along the third direction Z. Any two of the first connector 110, the second connector 120, and the third connector 130 are perpendicular to each other or intersect at a predetermined angle, and any two of the first connector 110, the second connector 120, and the third connector 130 are connected to each other via the three-way switches 140 to form N first connectors 110, M second connectors 120, N×M third connectors 130, and N×M three-way switches 140 arranged in a three-dimensional space, where N and M are positive integers greater than or equal to 1. In FIG. 1, X1 to X4 represent the first row to the fourth row of the first connectors 110, and Y1 to Y4 represent the first column to the fourth column of the second connectors 120.

Referring to FIGS. 1, 2A and 2B. Take an array of 4×4 three-way switches 140 as an example. Each three-way switch 140 has a first terminal 141, a second terminal 142, and a third terminal 143, a first switch 144, and a second switch 145. The first switch 144 is disposed between the first terminal 141 and the third terminal 143, and the second switch 145 is disposed between the second terminal 142 and the third terminal 143. Each first terminal 141 is disposed on a corresponding one of the first connectors 110, and each second terminal 142 is disposed on a corresponding one of the second connectors 120. Each third terminal 143 is disposed on a corresponding one of the third connectors 130. The positions of the third terminals 143 are represented by the coordinates Z(X, Y), where Z(1,1) represents the coordinates of the third terminal 143 connected to the first connector 110(X1) and the second connector 120(Y1), respectively. Z(1,4) represents the coordinates of the third terminal 143 connected to the first connector 110(X1) and the second connector 120(Y4), respectively. Z(4,1) represents the coordinates of the third terminal 143 connected to the first connector 110(X4) and the second connector 120 (Y1), respectively. Z(4,4) represents the coordinates of the third terminal 143 connected to the first connector 110(X4) and the second connector 120(Y4), respectively.

In an embodiment, the first switch 144 and the second switch 145 are, for example, mechanical or electronic switches, and the electronic switches are two-stage electronic switches, such as transistor switches, capacitive touch switches, resistive switches etc. Mechanical switches are micro-electromechanical system (MEMS) components, such as piezoelectric switches, photo-interrupt switches, reed switches, and hall switches. In order to reduce the volume of the components and space of layout, the first switch 144 and the second switch 145 are made of semiconductor devices, for example, Metal-Oxide-Semiconductor Field-Effect Transistors (MOSFETs) or silicon controlled switches are commonly used.

Referring to FIG. 2A, the first switch 144 has two states (0 or 1), the second switch 145 has two states (0 or 1), where 0 represents the switch is open, 1 represents the switch is closed, the following four signal states (0, 0) (0, 1) (1, 0) and (1, 1) can be obtained by combining the above states of the first and second switches 144 and 145, where (0, 0) means The first switch 144 and the second switch 145 are both open, so that the three-way switch 140 is in a completely open state, (0, 1) means that the first switch 144 is open and the second switch 145 is closed, so that the three-way switch 140 presents a single-way conduction state, (1, 0) means that the first switch 144 is closed and the second switch 145 is opened, so that the three-way switch 140 is in a single-way conduction state, (1, 1) means that the first switch 144 and the second switch 145 are both closed, so that the three-way switch 140 is in a completely conduction state.

Referring to FIG. 2B. In addition to the first switch 144 and the second switch 145, each three-way switch 140 may further include a third switch 146, which is disposed on the third connector 130. The third switch 146 is, for example, a mechanical or electronic switch, and the function of the third switch 146 is the same as that of the first switch 144 and the second switch 145, which will not be repeated here.

In FIG. 2B, the first switch 144 has two states (0 or 1), the second switch 145 has two states (0 or 1), and the third switch 146 has two states (0 or 1), where 0 means that the switch is open, and 1 means that the switch is closed. The following eight signal states (0, 0, 0), (0, 1, 0), (0, 1, 1), (0, 0, 1), (1, 0, 0), (1, 0, 1), (1, 1, 0), and (1, 1, 1) can be obtained by combining the above states of the first switch 144, the second switch 145, and the third switch 146, where (0, 0, 0) means that the three switches are all open, so that the three-way switch 140 is in a completely open state, (0, 1, 0), (0, 0, 1), (1, 0, 0) means that two switches are open and one switch is closed, so that the three-way switch 140 is in a single-way conduction state, (0, 1, 1), (1, 0, 1), (1, 1, 0) means that two switches are closed and one switch is open, so that the three-way switch 140 is in a two-way conduction state, (1, 1, 1) means that all three switches are closed, so that the three-way switch 140 is in a completely conduction state.

Figure 3:
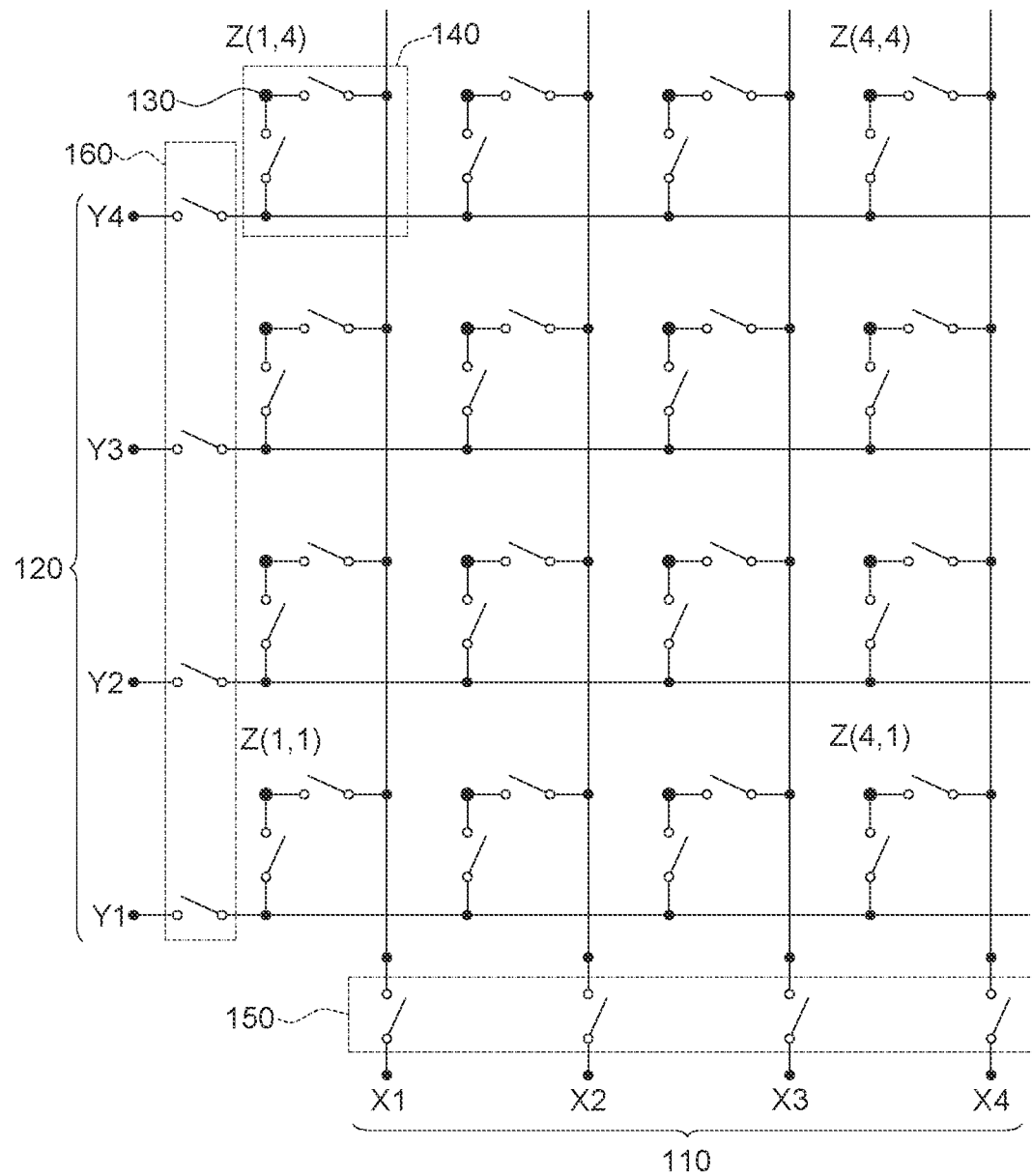
FIG. 3 is a schematic diagram of a three-way switch array structure according to another embodiment of the present invention.

Referring to FIG. 3, which is a schematic diagram of a three-way switch array structure 101 according to another embodiment of the present invention. The three-way switch array structure 101 is similar to the three-way switch array structure 100 of FIG. 2, except that a plurality of first terminal switches 150 and a plurality of second terminal switches 160 are provided, wherein the first terminal switches 150 are respectively disposed on corresponding first connectors 110 to control the signal state (0 or 1) of the M first terminals 141 located in the same row, and the second terminal switches 160 are respectively disposed on the corresponding second connectors 120 to control the signal state (0 or 1) of the N second terminals 142 located in the same column, where 0 indicates that the terminal switch is in an open state, and 1 indicates that the terminal switch is in a closed state.

In an embodiment, the first terminal switch 150 and the second terminal switch 160 are, for example, mechanical or electronic switches, and the functions of the terminal switches are the same as that of the first switch 144 and the second switch 145, which will not be repeated here. In addition, the first terminal switch 150 and the second terminal switch 160 are, for example, a multiplexer or a de-multiplexer. The multiplexer, also called data selector, is used for data selection at the data sending end to determine which data should be sent. The de-multiplexer, also called the data distributor, is used to distribute the data at the data receiving end to determine which data should be received.

The three-way switch array structure 101 of this embodiment is not only provided with a plurality of first terminal switches 150 and a plurality of second terminal switches 160, but also a third switch 146 as shown in FIG. 2B, whose function is similar to that of the first switch 144 and the second switch 145, which will not be repeated here.

Compared with the traditional solder-free universal circuit board (commonly known as "breadboard"), the three-way switch array structure 100, 101 of the above two embodiments can be applied to the electronic component configuration carrier to construct a three-dimensional layout of an electronic circuit. The difference from the traditional solder-free universal circuit board is that the above-mentioned first switch 144, second switch 145, third switch 146, first terminal switch 150, and second terminal switch 160 can be wireless switching elements, such as Bluetooth or Wi-Fi communication devices, to control the corresponding connector to be turned on or off.

Figure 4:
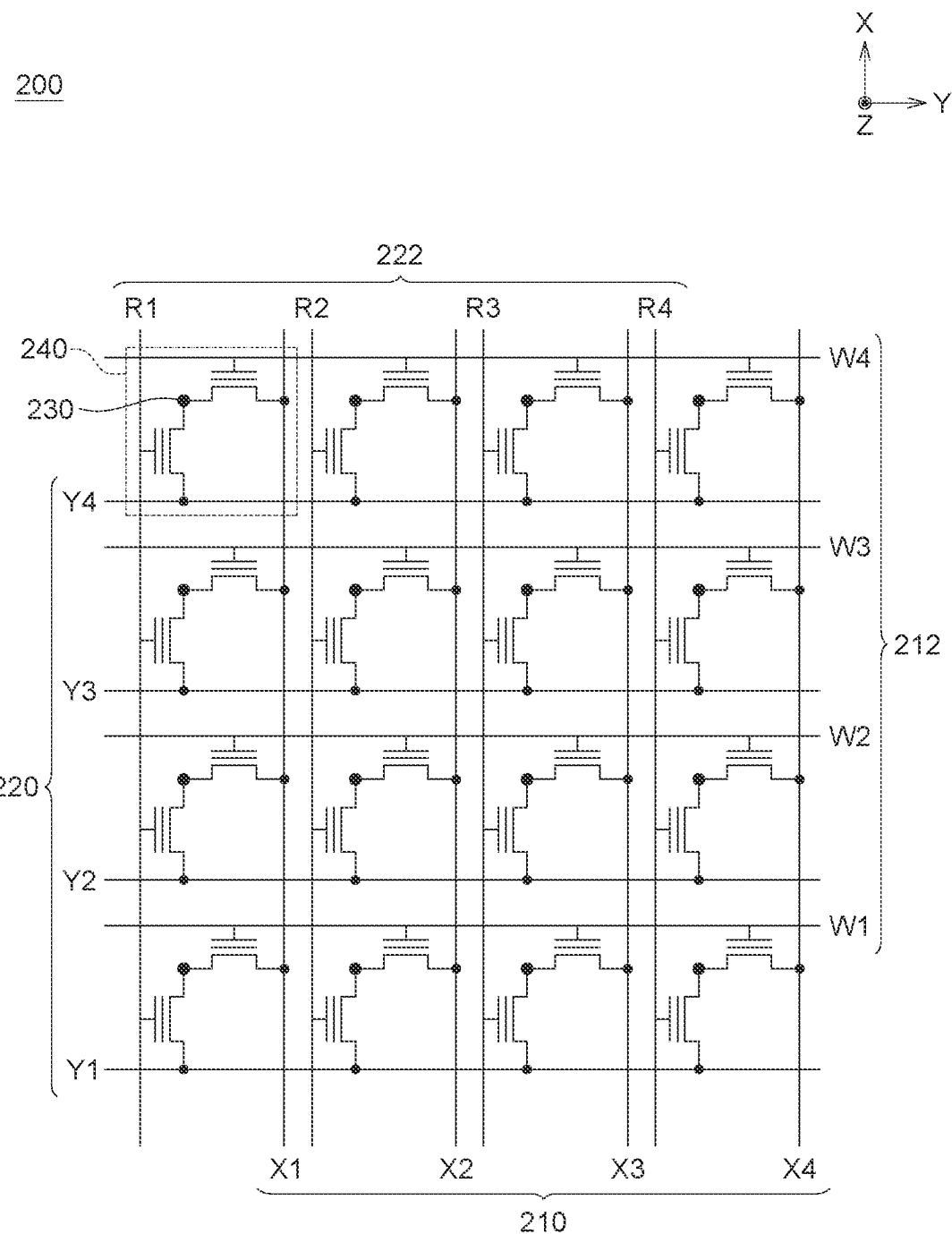
FIG. 4 is a schematic diagram of a switch array substrate based on NVM according to an embodiment of the present invention.
Figure 5:
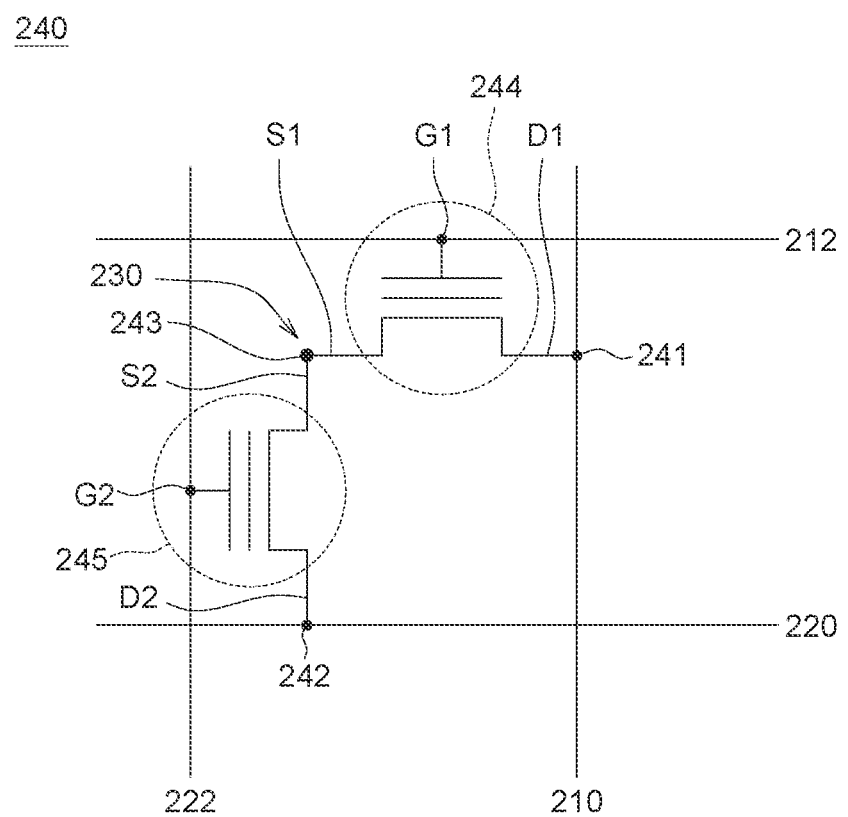
FIG. 5 is a schematic diagram of a three-way switch of FIG. 4.

Referring to FIGS. 4 and 5. FIG. 4 shows a schematic diagram of a switch array substrate 200 based on a NVM according to an embodiment of the present invention, and FIG. 5 shows a schematic diagram of a three-way switch 240 of FIG. 4. The switch array substrate 200 is, for example, a silicon wafer or an interposer, which includes a plurality of first connectors 210, a plurality of second connectors 220, a plurality of third connectors 230, a plurality of three-way switches 240, and a semiconductor substrate 250 (see FIG. 6). The first connector 210 is a conductive line extending along the first direction X, the second connector 220 is a conductive line extending along the second direction Y, and the third connector 230 is a conductive line extending along the third direction Z. Any two of the first connector 210, the second connector 220, and the third connector 230 are perpendicular to each other or intersect at a predetermined angle, and any two of the first connector 210, the second connector 220, and the third connector 230 are connected via the three-way switch 240 to form N first connectors 210, M second connectors 220, N×M third connectors 230, and N×M three-way switches 140 arranged in a three-dimensional space, where N and M are positive integers greater than or equal to 1.

Referring to FIGS. 4 and 5, taking an array of 4×4 three-way switches 240 as an example, each three-way switch 240 has a first terminal 241, a second terminal 242, a third terminal 243, a first memory cell 244 and a second memory cell 245. The first memory cell 244 is disposed between the first terminal 241 and the third terminal 243, and the second memory cell 245 is disposed between the second terminal 242 and the third terminal 243. Each first terminal 241 is disposed on corresponding one of the first connectors 210, and each second terminal 242 is disposed on corresponding one of the second connectors 220. Each third terminal 243 is disposed on corresponding one of the third connectors 230.

The first memory cell 244 can be used as a variable threshold voltage transistor, and the second memory cell 245 can also be used as a variable threshold voltage transistor, and the first memory cell 244 and the second memory cell 245 can be divided into PMOS transistors or NMOS transistors according to the majority carriers (holes or electrons) doped in the semiconductor substrate 250.

In addition to the first and second memory cells 244 and 245, each three-way switch 240 may also include a switch, which is disposed on the third connector 230. This switch is, for example, a mechanical or electronic switch, and its function is the same as that of the third switch 146 of the above-mentioned embodiment (see FIG. 2B), which will not be repeated here. In another embodiment, the aforementioned switch may also use a memory cell, that is, the three-way switch 240 may also include a third memory cell, such as a variable threshold voltage transistor, which has a function the same as that of the first memory cell 244 and the second memory cell 245, and will not be repeated here.

Referring to FIG. 5, the first memory cell 244 has two states (0 or 1) according to the threshold voltage of the stored charges, and the second memory cell 245 has two states (0 or 1) according to the threshold voltage of the stored charges, where 0 means the cell is in a high potential and 1 means the cell is in a low potential. The following four signal states (0, 0), (0, 1), (1, 0), and (1, 1) can be obtained by combining the above states of the three-way switch 240, where (0, 0) means that the two transistors in the first memory cell 244 and the second memory cell 245 are in data storage states, (0, 1) and (1, 0) means that a memory cell is at a low potential and the other memory cell is at a high potential, so that one transistor is in the data erasing state and the other transistor is in the data storage state, (1, 1) means that the two transistors in the first memory cell 244 and the second memory cell 245 are in a data erased state.

In addition, the third memory cell can also have two states (0 or 1) according to the threshold voltage of the stored charges. The following eight data states (0, 0, 0), (0, 1, 0), (0, 1, 1), (0, 0, 1), (1, 0, 0), (1, 0, 1), (1, 1, 0), and (1, 1, 1) can be obtained by combining the above states of the first memory cell 244, the second memory cell 245 and the third memory cell.

Referring to FIG. 5, the first memory cell 244 includes a first source S1, a first drain D1, and a first gate G1, the first source S1 is connected to the third terminal 243, the first drain D1 is connected to the first terminal 241, and the first gate G1 is connected to a power source (not shown) via a first word line 212. In addition, the second memory cell 245 includes a second source S2, a second drain D2, and a second gate G2. The second source S2 is connected to the third terminal 243, the second drain D2 is connected to the second terminal 242, and the second gate G2 is connected to a power source (not shown) via a second word line 222. Both of the first source S1 and the second source S2 can be connected to the third terminal 243, and based on connector requirements, the first memory unit 244 and the second memory unit 245 can be both in the open (0,0) state, in partially open/partially closed (1,0)/(0,1) state or both in closed (1,1) state. In one embodiment, the channel width is greater than 10 microns, but the value is not limited thereto.

The above-mentioned first gate G1 and second gate G2 are respectively electrically connected to the first word line 212 and the second word line 222 of different layers in the vertical direction, the first word line 212 and the two word lines 222 are perpendicular to each other, and the intersection of the first word line 212 and the second word line 222 is separated by an insulating layer (not shown). In FIG. 4, W1 to W4 represent the first column to the fourth column of the first word lines 212, respectively, and R1 to R4 represent the first row to the fourth row of the second word lines 222, respectively.

The material of the first gate G1 and the second gate G2 may include any suitable conductive material, such as selected from metals (for example, titanium, tungsten, cobalt, nickel, platinum, etc.), metal compositions (for example, metal silicide, metal nitride, metal carbide, etc.) and/or donor-doped semiconductor materials (for example, donor-doped silicon, donor-doped germanium, etc.). In addition, the channel material in the first memory cell 244 and the second memory cell 245 is, for example, gallium phosphide (GaP), which can provide a semiconductor material with a large band gap and a better charge carrier mobility than silicon, for example, and is compatible with the lattice of the semiconductor substrate 250.

Figure 6:
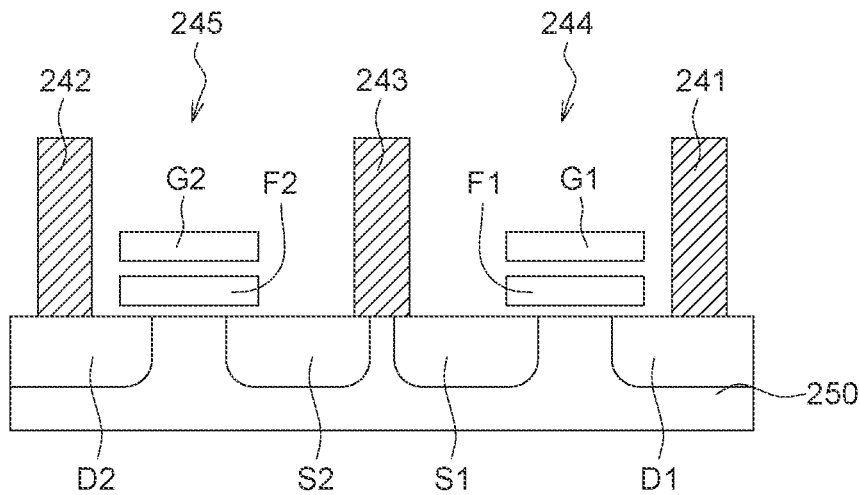
FIG. 6 is a schematic cross-sectional view of the memory cell in FIG. 5.

Referring to FIG. 6, which shows a schematic cross-sectional view of the memory cell 240 of FIG. 5. The first memory cell 244 and the second memory cell 245 are, for example, flash memories, which are formed on the semiconductor substrate 250. Since the flash memory is a NVM, each layer of floating gates F1 and F2 made of polysilicon or silicon nitride is added to the respective gates G1 and G2 of transistor, and the stored charges in the floating gates F1 and F2 is used to distinguish the state (0 or 1) of memory cell, because each of the floating gates F1 and F2 is surrounded by an insulator, when the power of gates G1 and G2 disappears, the charges are restricted in the floating gate F1 and F2 and will not dissipate to maintain its state (0 or 1).

In addition to flash memory, silicon-oxide-nitride-oxide-silicon (SONOS) memory and hafnium dioxide-based ferroelectric field effect transistors (FeFETs) may be used as the first memory cell 244 and the second memory cell 245.

In addition, magnetoresistive memory (MRAM), phase change memory (PCRAM), and resistive memory (RRAM) may also be used as the first memory cell 244 and the second memory cell 245.

Referring to FIG. 6, the semiconductor substrate 250 can be made of any suitable basic semiconductor (such as crystalline silicon or germanium), compound semiconductor (such as silicon carbide, gallium arsenide, gallium phosphide, iodine phosphide, arsenic Iodine and/or iodine antimonide) or a combination of the above. The semiconductor substrate 250 is, for example, a P-type substrate, and the polarity of impurities doped in the first source S1 and the first drain D1 is N-type. When a positive voltage is applied to the first gate G1, the electrons will be attracted to the surface of the semiconductor substrate 250 to form a channel so that the majority carriers (electrons) of the semiconductor substrate 250 can flow from the first source S1 to the first drain D1. If the positive voltage is removed from the first gate G1 or a negative voltage is applied, the channel cannot be formed, and the majority carriers (electrons) cannot flow between the first source S1 and the first drain D1. Similarly, when a positive voltage is applied to the second gate G2, the electrons will be attracted to the surface of the semiconductor substrate 250 to form a channel, so that the majority carriers (electrons) of the semiconductor substrate 250 can flow from the second source S2 to the second drain D2. If the positive voltage is removed from the second gate G2 or a negative voltage is applied, the channel cannot be formed, and the majority carriers (electrons) cannot flow between the second source S2 and the second drain D2. In another embodiment, the semiconductor substrate 250 is, for example, an N-type substrate, so that the polarity of impurities doped in the first source S1 and the first drain D1 is P-type, and the majority carriers are electron holes.

Figure 7:
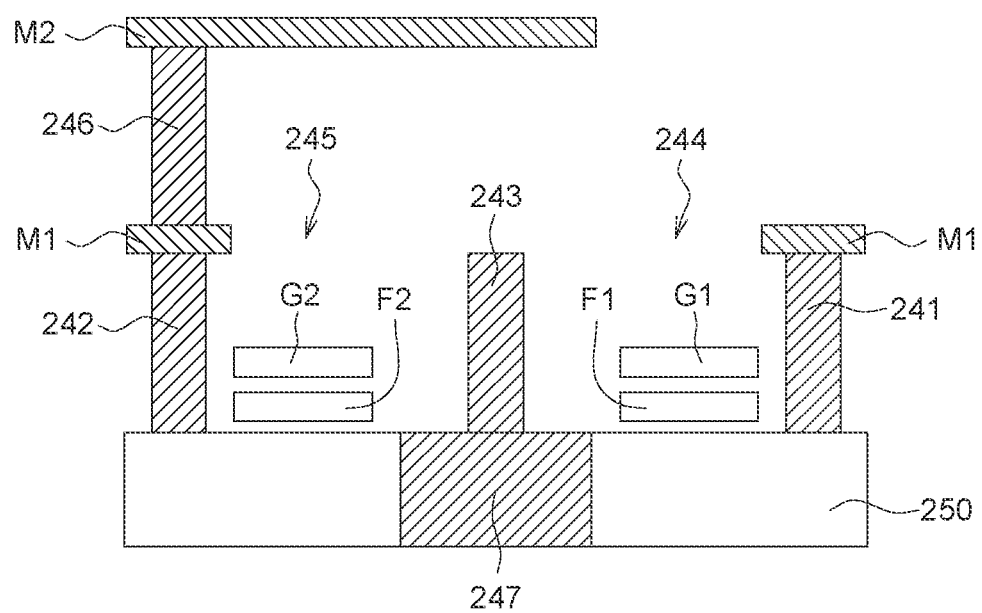
FIG. 7 is a schematic cross-sectional view of the memory cell and a vertical conduction structure thereof in FIG. 5.

Referring to FIG. 7, which shows a schematic cross-sectional view of the memory cell and its vertical conduction structure in FIG. 5. In the present embodiment, the first terminal 241, the second terminal 242, and the third terminal 243 may include suitable conductive materials, such as tungsten. The first terminal 241 is, for example, a conductive plug, which is electrically connected to the first metal layer M1 and vertically stacked with the first metal layer M1, and the second terminal 242 is, for example, a conductive plug, which is electrically connected to the first metal layer M1 and the second metal layer M2 and vertically stacked with the first metal layer M1 and the second metal layer M2 via another conductive plug 246, and the first metal layer M1 and the second metal layer M2 are isolated from each other by an insulating layer (not shown). In addition, the third terminal 243 is, for example, a conductive plug, and the semiconductor substrate 250 has a substrate penetration structure 247 vertically stacked with the third terminal 243, such as a through silicon via (TSV), so that the third terminal 143 can be electrically connected with a chiplet on a wafer-level package in a vertical direction through the substrate penetration structure 247 and a wafer-level three-dimensional IC package structure is formed.

In view of the above, through the above-mentioned vertical conduction structure, the first terminal 241 and the second terminal 242 are electrically connected to the first metal layer M1 and the second metal layer M2 on different layers in the vertical direction, and the metal layer M1 is, for example, a first bit line (i.e., the first connector 210), and the second metal layer M2 is, for example, a second bit line (i.e., the second connector 220). The first metal layer M1 and the second metal layer M2 are perpendicular to each other, and the intersection of the first metal layer M1 and the second metal layer M2 is separated by an insulating layer (not shown).

Figure 8:
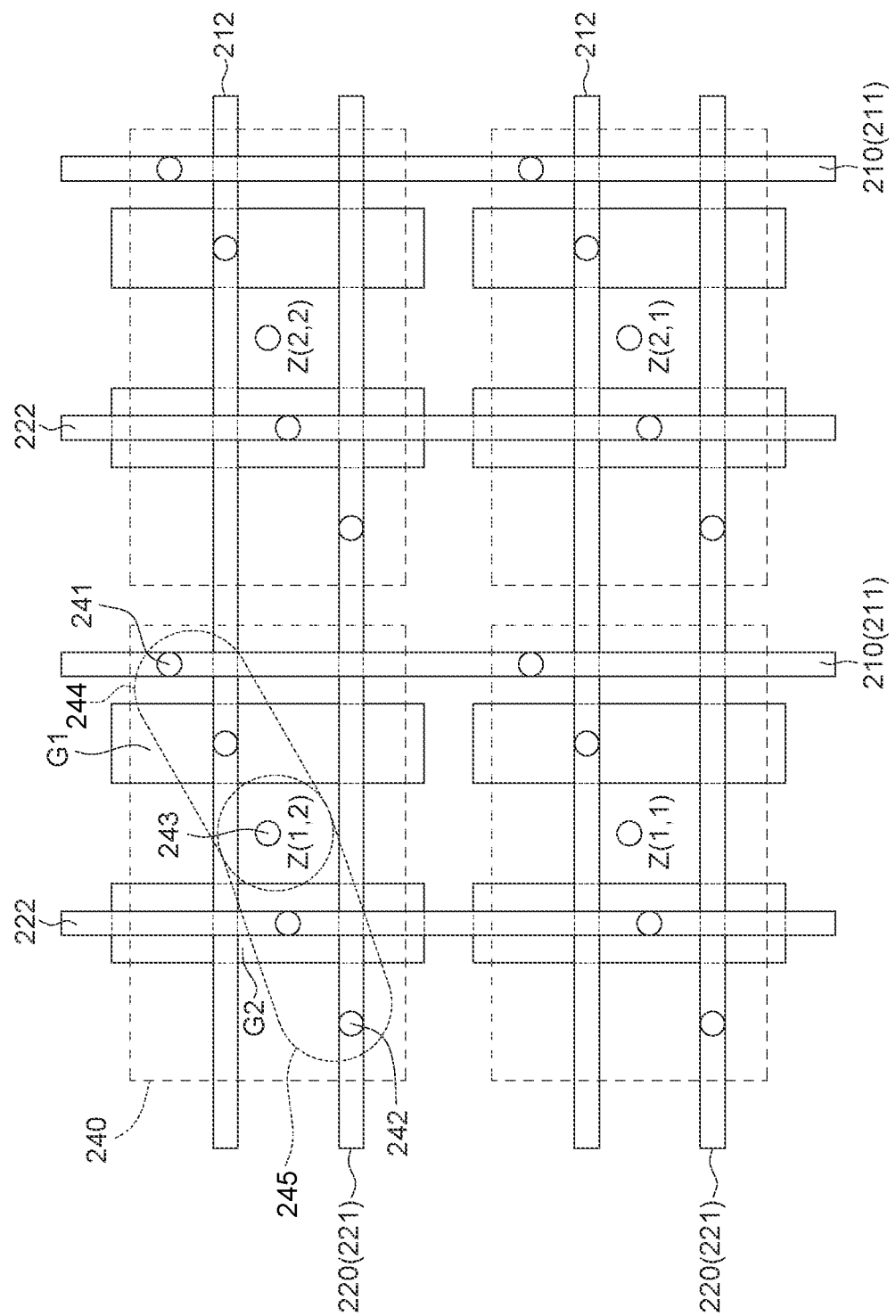
FIG. 8 is a schematic top view of 2×2 switch array substrate based on NVM in FIG. 4.

FIG. 8 is a schematic top view of 2×2 three-way switches 240 according to FIG. 5. Referring to FIG. 8, the position of each third terminal 243 is represented by coordinates Z(X, Y), each of the first gates G1 is connected to corresponding one of the first word lines 212, and each of the second gates G2 is connected to corresponding one of the second word lines 222, the first word lines 212 and the second word lines 222 are non-parallel and within different levels. In addition, referring to FIGS. 6, 7 and 8, the first drain D1 is connected to a first drain line 211 (i.e., the first connector 210 or the first metal layer M1) via the first terminal 241, and the second drain D2 is connected to a second drain line 221 (i.e., the second connector 220 or the second metal layer M2) via the second terminal 242, the first drain line 211 and the second drain line 221 are non-parallel and within different levels. In this embodiment, the first drain line 211 and the second word line 222 are substantially parallel to each other, and the second drain line 221 and the first word line 212 are substantially parallel to each other.

In addition, referring to FIG. 8, the three-way switches 240 located on a row in an extension direction of the first connectors 210 are together connected with one of the first connectors 210, and the three-way switches located on a column in an extension direction of the second connectors 220 are connected together with one of the second connectors 220.

The three-way switch array structure and the NVM-based switch array substrate of the above-mentioned embodiments of the present invention can be applied to an electronic component configuration carrier to construct an electronic circuit with three-dimensional layout. For the electronic circuit layout of the memory array, through the three-way switches composed of multiple memory cells, the switch array substrate and the chiplet on the wafer-level package can be stacked and electrically connected to each other in the vertical direction to form a wafer-level three-dimensional IC packaging structure.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-way switch array structure, comprising:
   N first connectors;
   M second connectors;

N×M third connectors;
N×M three-way switches, each three-way switch has a first terminal, a second terminal, a third terminal, a first switch, and a second switch, wherein each of the first terminals is disposed on one of the N first connectors, each of the second terminals is disposed on one of the M second connectors, each of the third terminals is disposed on one of the N×M third connectors, and the first switch is disposed between the first terminal and the third terminal, the second switch is disposed between the second terminal and the third terminal, where N and M are positive integers greater than or equal to 1; and
N terminal switches, respectively disposed on the N first connectors.

2. The array structure according to claim 1, further comprising M terminal switches, respectively disposed on the M second connectors.

3. The array structure according to claim 1, further comprising N×M third switches, respectively disposed on the N×M third connectors.

4. The array structure according to claim 1, applied to an electronic component configuration carrier to construct an electronic circuit with a three-dimensional layout.

5. A switch array substrate based on Non-Volatile Memory (NVM), comprising:
N first connectors;
M second connectors;
N×M third connectors;
N×M three-way switches, each three-way switch has a first terminal, a second terminal, a third terminal, a first memory cell and a second memory cell, wherein each of the first terminals is disposed on one of the N first connectors, each of the second terminals is disposed on one of the M second connectors, each of the third terminals is disposed on one of the N×M third connectors, the first memory cell is disposed between the first terminal and the third terminal, and the second memory cell is disposed between the second terminal and the third terminal, where N and M are positive integers greater than or equal to 1; and
a semiconductor substrate for disposing the N first connectors, the M second connector, the N×M third connectors and the N×M three-way switches.

6. The substrate according to claim 5, wherein the first memory cell comprises a first source, a first drain, and a first gate, and the first source is connected to the third connector, the first drain is connected to the first terminal, and the first gate is connected to a first word line.

7. The substrate according to claim 6, wherein the second memory cell comprises a second source, a second drain, and a second gate, and the second source is connected to the third connector, the second drain is connected to the second terminal, and the second gate is connected to a second word line.

8. The substrate according to claim 6, wherein the first word line is parallel with the second connectors.

9. The substrate according to claim 7, wherein the second word line is parallel with the first connectors.

10. The substrate according to claim 7, wherein the first word line is perpendicular with the second word line.

11. The substrate according to claim 5, wherein the first memory cell and the second memory cell are flash memories.

12. The substrate according to claim 5, wherein the first memory cell and the second memory cell are variable threshold voltage transistors.

13. The substrate according to claim 5, further comprising N×M third memory cells, respectively disposed on the N×M third connectors.

14. The substrate according to claim 5, wherein the first terminal electrically connects to a first drain line in a first metal layer.

15. The substrate according to claim 14, wherein the second terminal electrically connects to a second drain line in a second metal layer, the first drain line and the second drain line are non-parallel.

16. The substrate according to claim 15, wherein the first metal layer and the second metal layer are within different levels.

17. The substrate according to claim 5, wherein the third terminal electrically connects to a through silicon via (TSV) passing through the semiconductor substrate.

18. The substrate according to claim 5, wherein the plurality of three-way switches located on a row in an extension direction of the first connectors are together connected with one of the first connectors.

19. The substrate according to claim 5, wherein the plurality of three-way switches located on a column in an extension direction of the second connectors are connected together with one of the second connectors.

* * * * *